(12) United States Patent  (10) Patent No.: US 7,724,537 B1
Grantham  (45) Date of Patent: May 25, 2010

(54) LOCK DOWN DEVICE

(75) Inventor: Dockins W. Grantham, Fairfax, VA (US)

(73) Assignee: The Grantham Family, L.P., Fairfax, VA (US)

(*) Notice: Subject to any disclaimer, the term of this patent is extended or adjusted under 35 U.S.C. 154(b) by 903 days.

(21) Appl. No.: 11/487,320

(22) Filed: Jul. 17, 2006

(51) Int. Cl.
*H05K 7/12* (2006.01)
*H05K 7/20* (2006.01)

(52) U.S. Cl. .................. 361/801; 361/759; 361/747; 361/679.53; 361/679.58

(58) Field of Classification Search .......... 361/698, 361/699, 747, 759, 801, 679.52, 679.53, 361/679.58; 312/223.2, 223.3
See application file for complete search history.

(56) References Cited

U.S. PATENT DOCUMENTS

| | | | | |
|---|---|---|---|---|
| 6,016,251 A * | 1/2000 | Koide et al. | ............... | 361/699 |
| 6,017,004 A * | 1/2000 | Grantham | ............... | 248/27.3 |
| 6,056,574 A * | 5/2000 | Yeomans et al. | ............ | 439/327 |
| 6,256,191 B1 | 7/2001 | Curlee | | |
| 6,442,037 B1 * | 8/2002 | Boe | ............ | 361/759 |
| 6,671,184 B1 * | 12/2003 | Barringer et al. | ............ | 361/801 |
| 6,816,383 B2 * | 11/2004 | Barringer et al. | ............ | 361/759 |
| 6,870,744 B2 * | 3/2005 | Kosugi et al. | ............... | 361/801 |
| 7,013,955 B2 * | 3/2006 | Phillips et al. | ......... | 165/104.21 |
| 7,149,087 B2 * | 12/2006 | Wilson et al. | ............... | 361/699 |
| 7,515,437 B2 | 4/2009 | Dean et al. | | |
| 2004/0017658 A1 * | 1/2004 | Lo et al. | ............... | 361/698 |

* cited by examiner

*Primary Examiner*—Dameon E Levi
(74) *Attorney, Agent, or Firm*—Vedder Price P.C.; Ajay A. Jagtiani

(57) ABSTRACT

A lock down device is disclosed that provides lateral stability and rigidity to at least one elongated item in relationship to a support structure. The lock down device may comprise a securing mechanism for use securing the device to the support structure. A receiving port, optionally strengthen with a brace, may be included to enable liquid cooled boards to be used in conjunction with the device. Seating channels, along either the first and/or second side retain and support the item and, at the proximal end, an L-shape may be used to provide additional support. A bridge notch may be placed in the first and/or second sides to enable the locking device to seat properly when a bridge is used to connect two boards. The lock down device may be secured through locking tabs having receiving holes for screws V-shaped tabs, button tabs, or any other applicable mechanism.

56 Claims, 11 Drawing Sheets

LOCK DOWN DEVICE

BACKGROUND

1. Field of the Invention

The present invention relates generally to a lock down device, and more particularly to a device for securing items to a structure.

2. Related Art

Computers, particularly IBM-compatible computers, often use expansion cards to add functions not performed by the computer's motherboard. Typical expansion cards have contact portions that are inserted into expansion slots of a computer's motherboard. Common expansion cards include, for example, graphics cards, video adapter cards, internal modem cards, sound cards, disk drive controller cards, network interface cards and the like.

Early personal computers (also sometimes referred to as microcomputers) often used full-length expansion cards that were inserted into the motherboard's expansion slots and secured at both ends with screws to the computer's chassis. Over time, manufacturers continuously improved expansion cards, adding more features and significantly reducing their size, particularly the length and the height, of the cards. Today, these smaller more powerful expansion cards are often secured with a single screw to one side of a computer's case (also referred to as a chassis).

Additionally, due to the increasing speed of modern computers and the growing demand for more realistic and faster graphic displays, manufacturers of graphics processing units (GPUs) have been advancing graphic card technology to support the ever increasing graphics performance demands of garners, visualization and simulation users (for example, medical devices), CAD users, and others. Further, current graphics cards are designed for insertion into either Accelerated Graphics Port (AGP) or Peripheral Component Interconnect (PCI) Express motherboard connections (i.e., AGP or PCI Express Interfaces). As these graphics cards have grown more powerful, their power consumption has increased, thereby generating more heat within the computer. For example, some of the more powerful graphics cards use as much power as the computer's central processing unit (CPU), and have their own heat sink and fan, which adds additional mass and weight to the cards.

To counter the heat generated by the more powerful graphics cards, some cards are liquid cooled. One popular design uses tubes at the top of the card to circulate liquid through the heat sink. The use of liquid cooling, however, adds additional mass and weight to the cards.

These more powerful and often heavier expansion cards have increased service costs for manufacturers, assemblers and resellers of personal computers. For example, the securing method for these cards (e.g., a single screw) often does not sufficiently retain and/or stabilize the card. As such, it is not uncommon for expansion cards to dislodge and/or break during manufacturing, packaging, transportation, and/or physical movement of the assembled computer. To counter this, lock down devices have been manufactured to help secure these expansion cards to the computer case.

U.S. Pat. No. 6,017,004 discloses one prior art computer card lock down device for securing expansion cards to reduce the likelihood of the card becoming wholly or partially dislodged during shipment. Although this device provides some protection for standard cards, it is not readily adaptable for use with the new, heavier, liquid cooled cards.

U.S. Pat. No. 6,256,191 discloses a second lock down device for securing an expansion card. This device uses a compression spring in securing the card. This device, however, is likewise not easily readily adaptable for securing heavier liquid cooled cards.

In addition to these prior art lock down devices being deficient in securing liquid cooled expansion cards, they are further deficient for securing two or more interconnected expansion cards (referred to as dual or quad card configurations). For example, to meet growing demands for improved graphics and system performance, graphics manufacturers have developed technologies permitting two or four graphics cards to be installed in a single system that are able to work together to offer improved graphics performance. Such graphics technologies include NVIDIA's SLI dual and quad graphics card technologies and ATI's Crossfire dual graphics card technology. These technologies typically require a bridge that connects the multiple (e.g., two) graphics cards. Although, this bridge provides an electrical connection between the cards, it offers little, if any, rigidity and, itself, may become dislodged during movement of the system if not properly retained. Further, the bridge may raise the profile of the graphics card above the edge of the graphics card, thereby preventing proper seating of prior art lock down devices. As such, there is a need for new and improved lock down devices.

SUMMARY

According to an aspect of the present invention, there is provided a lock down device for securing one or more items to a support structure. This lock down device comprises a securing mechanism configured to receive a locking mechanism for use in securing the lock down device to the support structure, at least one receiving port extending through the lock down device, and at least one set of one or more seating slots, wherein at least one set of seating slots is along a side of the lock down device and dimensioned for holding at least a portion of the item.

According to another aspect, there is provided a lock down device comprising a securing mechanism comprising one or more locking tabs each comprising one or more screw receiving holes for securing the lock down device to a computer case, a first set of one or more seating slots along a first side of the lock down device dimensioned for holding at least a portion of a first circuit board, and a second set of one or more seating slots along a second side of the lock down device dimensioned for holding at least a portion of a second circuit board.

According to yet another aspect there is provided a method of retaining a circuit board within a computer case. This method comprises placing an edge connector of the circuit board into a slot in the computer case, placing circulating tubes for a liquid cooling system through a receiving port, placing each of a set of one or more seating slots of a lock down device on a keep out area of the circuit board, and attaching the lock down device to a computer case using a securing mechanism of the lock down device.

According to yet another aspect there is provided a method of retaining multiple circuit boards within a computer case. This method comprises placing an edge connector of a first circuit board into a first slot in the computer case, placing an edge connector of a second circuit board into a second slot in the computer case, placing circulating tubes for a liquid cooling system of one circuit board through a receiving port, placing circulating tubes for a liquid cooling system of another circuit board through a receiving port, placing each of a first set of one or more seating slots of a lock down device on a keep out area of the first circuit board, placing each of a second set of one or more seating slots of the lock down device on a second circuit board, and attaching the lock down device to a computer case using a securing mechanism of the lock down device.

According to yet another aspect there is provided a lock down device for securing one or more items to a support structure. This lock down device comprises a first body comprising at least one receiving port extending through the first body and at least one set of one or more seating slots, wherein at least one set of seating slots is along a side of the lock down device and dimensioned for holding at least a portion of the item. The lock down device further comprises a second body comprising at least one receiving port extending through the second body and at least one set of one or more seating slots, wherein at least one set of seating slots is along a side of the lock down device and dimensioned for holding at least a portion of the item. Additionally, the lock down device comprises a securing mechanism extending between the first body and the second body and configured to receive a locking mechanism for use in securing the lock down device to the support structure.

The summary and the following detailed description should not restrict the scope of the claimed invention. Both provide examples and explanations to enable others to practice the invention. The accompanying drawings, which form part of the description for carrying out the best mode of the invention, show several embodiments of the invention, and together with the description, explain the principles of the invention

BRIEF DESCRIPTION OF THE DRAWINGS

Embodiments of the present invention are described herein in conjunction with the accompanying drawings, in which.

DESCRIPTION

Figure 1A:
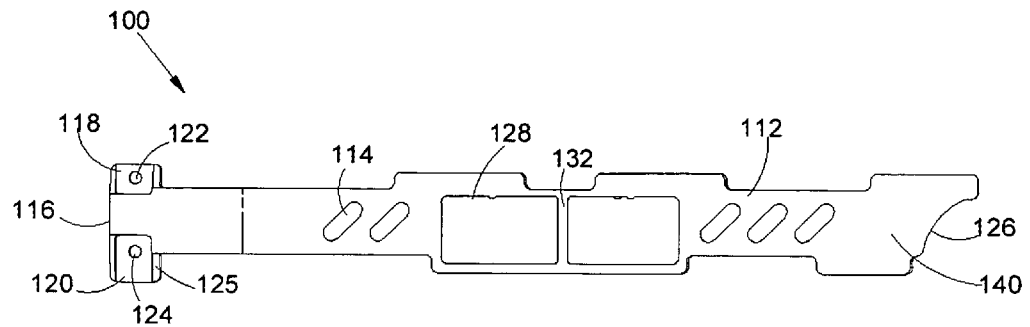
FIG. 1A is a top view of the lock down device in accordance with an embodiment of the present invention.
Figure 1B:
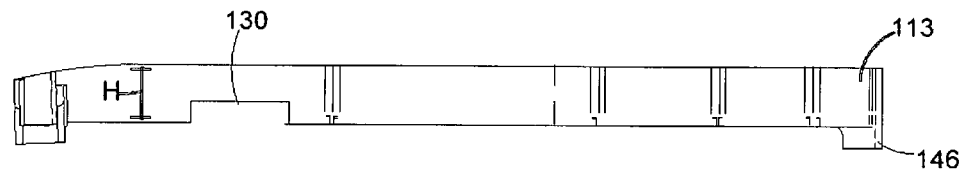
FIG. 1B is a side view of the lock down device in accordance with the embodiment of FIG. 1.
Figure 1C:
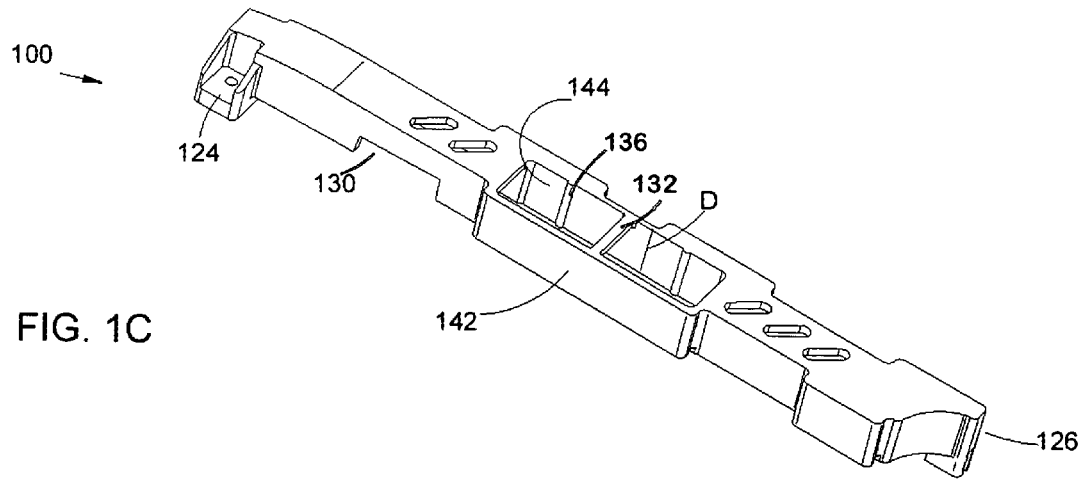
FIG. 1C is perspective view of the top of the lock down device of FIG. 1 in accordance with the embodiment of FIG. 1.
Figure 1D:
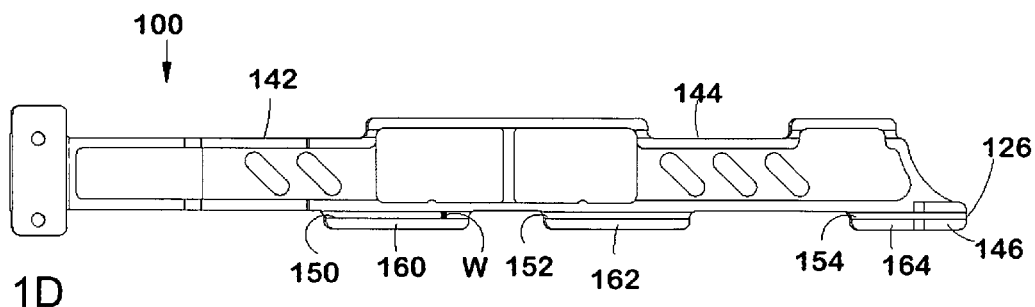
FIG. 1D is a bottom view of the lock down device in accordance with the embodiment of FIG. 1.
Figure 1E:
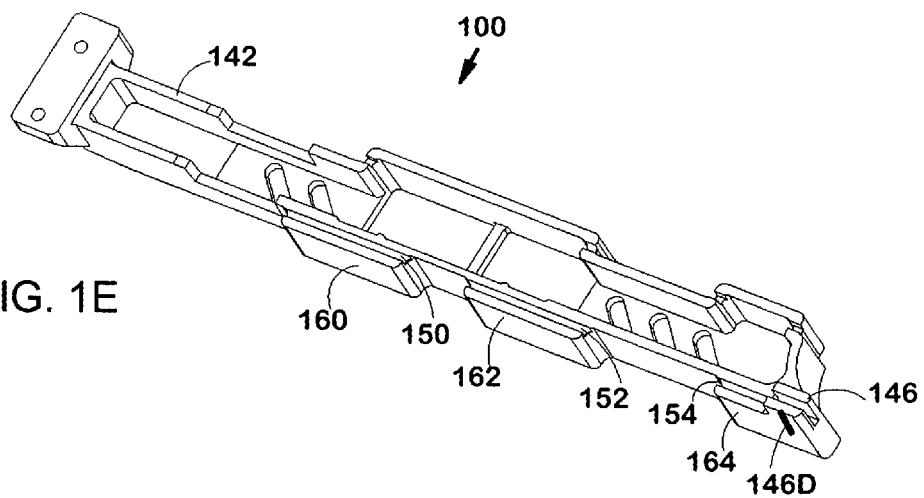
FIG. 1E is perspective view of the underside of the lock down device in accordance with the embodiment of FIG. 1.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "bridge" refers to any device that spans two or more circuit boards to provide the electronic connection between the boards.

For the purposes of the present invention, the term "circuit board" refers to an apparatus that comprises one or more electronic components capable of performing one or more functions.

For the purposes of the present invention, the term "cooling area" refers to a portion of a system that comprises materials and/or items for use in cooling the system. For example, a cooling area may include a portion of a system that stores a circulating material so that it may dissipate heat, where the circulating material circulates through the system to absorb heat and accordingly cool the system. Further, the cooling area may also comprise mechanisms for actively cooling the circulating material. Additionally, the cooling area may comprise, for example, a water block, a compressor/condenser/evaporator combination, a heat pump, or other mechanism for circulating and cooling the material circulating through the heat sink.

For the purposes of the present invention, the term "edge connector" refers to a portion of an expansion card for connecting the expansion card to a device, such as, for example a computer.

For the purposes of the present invention, the term "expansion card" refers to a circuit board capable of connecting to a computer. Exemplary expansion cards include, for example, graphics cards, video cards, sound cards, etc.

For the purposes of the present invention, the term "expansion slot" refers to an opening in a computer in which an expansion card may be inserted.

For the purposes of the present invention, the term "heat sink" refers to an object capable of dissipating heat generated by an electronic device.

For the purposes of the present invention, the term "keep out area" refers to an area of an expansion card in which electronic components are not to be installed.

For the purposes of the present invention, the term "liquid cooled" refers to a cooling system using, vapor phase, liquid and/or any material capable of dissipating, heat generated by an electronic device.

For the purposes of the present invention, the term "locking mechanism" refers to any device that may secure (e.g., permanently and/or removably) one object to another. These may include, but are not limited to, screws, rivets, adhesives, solder, v-shaped locks, buttons on the lock down unit that fit into receiving holes, snap in fasteners, or receiving channels and flanges.

For the purposes of the present invention, the term "seated" refers to a device being located in one or more receiving slots of and apparatus, such as, for example, a lock down device.

For the purposes of the present invention, the term "securing mechanism" refers to any portion of the lock down device that is designed to receive a locking mechanism to permanently and/or removably secure the lock device to a structure.

For the purposes of the present invention, the terms "transportation" or "transporting" refers to any movement of a device (e.g., a computer), such as for example, during manufacturing, assembling, packaging, shipping, and relocating, including, but not limited to relocation due to local area network ("LAN") parties, office and/or home reorganization or taking a computer in to a shop for repair.

For the purpose of the present invention, the terms "item," "component," "device," "apparatus," and "system," shall be considered synonyms and used interchangeably.

DESCRIPTION

Reference will now be made in detail to the exemplary embodiments of the invention, examples of which are illustrated in the accompanying drawings. Wherever possible, the same reference numbers will be used throughout the drawings to refer to the same or like parts.

An aspect of the present invention is directed to a lock down device for use in retaining an expansion card in an electronic device, such as, for example, a computer to help in reducing the risk of breakage or dislodgment of the expansion card, such as, for example during transportation of the electronic device. Exemplary expansion cards may include for example, graphics cards, sound cards, modem cards, firewire cards, etc.

Embodiments of the presently described lock down device may be configured for retaining expansion cards employing liquid cooling systems. Or, for example, embodiments of the lock down device may be used in dual and quad expansion card configurations, such as, for example, NVIDIA's SLI dual and quad graphics card systems. In addition to retaining expansion cards in electronic devices, such as computers, embodiments of the present invention may also be used for retaining other types of circuit boards and/or objects to other types of structures. For example, in robotics, circuitry is typically located on the moving robot thereby subjecting the circuitry to both movement and jarring. Embodiments of the present invention may be used in such applications for retaining a circuit board in its correct position to help ensure proper functioning of the robotics. Additionally, embodiments of the present invention may also be used in optical research where filters are often required to be both easily exchangeable and, when installed, to remain in the desired position despite any jarring that system may undergo.

FIGS. 1A through 1E, illustrate different views of an exemplary lock down device, in accordance with an aspect of the invention. Lock down device 100 is preferably manufactured from a non-conductive material, such as, for example, a plastic, nylon or one or more composite materials. Further, lock down device 100 may be molded, for example, using a single piece mold. Although these are some exemplary methods and materials that may be used to manufacture lock down device 100, it should be noted that lock down device 100 may be manufactured from any material suitable to provide results desired for the particular application to which the lock down device is to be placed. For example, in some applications it may be preferable for lock down device 100 to be flame retardant. In such an application, a flame retardant material may be used in the manufacture of lock down device 100. Further, although lock down device 100 is illustrated as a single object with multiple parts, in other embodiments lock down device 100 may be constructed of multiple parts secured in any applicable manner without departing from the invention. Further, although in computer use the lock down device 100 would typically extend at a 90 degree angle in order to meet current standards, the device may be modified to retain an item at any desired angle.

As illustrated, lock down device 100 comprises an elongated body 112 having a proximal end 116 and a distal end 126. Elongated body 112 is illustrated in this example as having a U-shape with a top 140, a pair of sides 142 and 144 and a hollow interior. Proximal end 116 comprises a securing mechanism 125 that, as will be described below, may be used to secure lock down device 100 to a support structure, such as a computer case. Elongated body 112 also may comprise vent holes 114 that serve to permit general air flow within the area, as well as reduce, without structural compromise, the weight and amount of materials used to produce lock down device 100.

Lock down device 100 also comprises a receiving port 128. These receiving ports 128 may be used for accepting circulation tubes of a liquid cooled expansion card. As shown, a brace 132 may span tube receiving port 128, dividing port 128 into two sections in order to improve structural integrity of lock down device 100. As show, in this example, brace 132 is located in the center of receiving port 128. However, depending upon the expected end use of lock down device 100, brace 132 need not be used, or multiple braces, may be placed at any point within receiving port 128.

The distal end 126 of lock down device 100 is preferably curved. This may be helpful in securing certain graphics card designs. For example, some graphics cards are designed to accommodate a "daughter card." The incorporation of a curve in distal end 126 provides clearance for the addition of the "daughter card." Although illustrated in these figures as curved, in other embodiments, distal end 126 may be straight, such as, for example, the single card design illustrated in the below discussed embodiment of FIG. 3.

In addition, lock down device 100 may include a notch 130. As noted above, lock down device 100 may be used for retaining expansion cards implementing a multi-graphics card system (e.g., NVIDIA's SLI technology or ATI's crossfire technology, which both of which use two interconnected graphics cards). Notch 130 is preferably located at the expected location of the bridge that is or will be used to interconnect the two graphics cards in such implementations. Thus, notch 130 permits lock down device 100 to be properly seated with expansion cards using a bridge. Further, notch 130 preferably only extends into body 112 a minimal amount in order to maintain structural integrity of lock down device 100. For example, in an embodiment notch 130 extends to about 50% of the height "H" of side 142 of lock down device 100 to provide sufficient space for the bridge. However other dimensioning may be used without departing from the scope of the invention.

As shown, proximal end 116 of device 100 of this exemplary lock down device 100 comprises a securing mechanism 125. This securing mechanism 125 comprises lock down tabs 118 and 120, each of which includes receiving holes 122 and 124. Lock down tabs 118 and 120 are preferably for use in securing lock down device 100 to a structure, such as a computer case that has a ledge with threaded screw holes (not shown), as will be described below with reference to FIGS. 2 and 3. It should be noted that this is but one example of a securing means for securing lock down device 100 to a structure and other mechanisms may be used without departing from the invention, such as, for example, the mechanisms employed by the alternative embodiments discussed below.

Computer cases typically include threaded securing holes at predetermined standard locations for use in, for example, securing a motherboard and/or expansion cards to the computer case. In an embodiment, locked down device 100 is capable of being secured to computer cases using these standardized securing holes. Further, other structures (e.g., cases) may also include standardized or custom mechanisms for attaching expansion cards, motherboards, and/or lock down device 100 to the structure. Lock down device 100 may accordingly in other embodiments include appropriate securing mechanisms for attaching to these standardized or custom securing mechanisms.

As illustrated, lock down device 100 may also comprise seating slots 150, 152 and 154 that are formed on a first side by side 142 of lock down device 100 and on a second side by retaining walls 160, 162 and 164. Seating slots 150, 152, 154 are preferably dimensioned for holding a side of the item (e.g., expansion card) to be secured by lock down device 100. A more detailed description of how lock down device 100 may be used to secure an expansion card to a computer case will be provided below with reference to FIGS. 1F and 1G.

Lock down device 100 may also include a tip 146 located at distal end 126 such that seating slot 154 is L-shaped. Such an L-shape may help provide additional support for the end of the item (e.g., expansion card) to be secured by lock down device 100. Seating slot 154 is also preferably open at distal end 126 to enable lock down device 100 to accommodate expansion cards, or other items, having a length longer than body 112. The depth "146D" of tip 146 and seating slots 150, 152, and 154 may vary depending upon the item to be retained, and as such may be deeper or shallower than as illustrated. Further, the width, W, (i.e., the distance between side 142 and retaining walls 160, 162, and 164, respectively) of seating slots 150, 152 and 154 may be slightly greater than the item (e.g., expansion card) to be retained, thus helping provide a firm, but not damaging, grip of the item. The width, W, of seating slots 150, 152 and 154 also is preferably sufficient to permit the item (e.g., an expansion card) to be properly seated in order to provide lateral stability. It should be noted that this provides but one example, and the number of and dimensions of seating slots 150, 152 and 154 may vary depending upon the density, weight, size and rigidity of the item (e.g., expansion card) to be retained. For example, although this embodiment illustrates a lock down device 100 with 3 seating slots, in other embodiments a different number of seating slots may be used, they may be located at different locations, or their dimensions may be different. For example, in other embodiments, lock down device 100 may simply include a single seating slot, such as illustrated in the below described FIG. 6 that runs a substantial portion of the length of lock down device 100. In this example, seating slots 150, 152, and 154 are preferably located at the expected point of greatest mass of the item (e.g., expansion card) to be retained. This helps provide support at the heaviest portion of the item.

As shown, lock down device 100 may also comprise interior ribs 136 that extend along the tube receiving ports 128. Ribs 136 preferably provide structural strength to lock down device 100 by adding resistance to breakage and increasing stability of lock down device 100. Ribs are commonly used in the plastic arts for reinforcement and the specific size and spacing of the ribs, as is known to those of skill in the art, will be dependent on, for example, the particular use to which the lock down device is to be placed, the materials used to manufacture the lock down device 100, etc. Further, in embodiments, additional ribs may be used in other areas of lock down device 100, such as for example, along at least a portion of the length of sides 142 and 144.

As noted above, FIGS. 1A-1E illustrates a lock down device 100 for securing a single expansion card. In systems employing multiple expansion cards, additional lock down devices 100 may be used to support the additional expansion cards. It should be noted that the lock down device 100 disclosed in FIGS. 1A-1E may also be used in a system employing other types of lock down devices, such as those of the prior art, without departing from the scope of the invention. For example, in a computer system in which only one expansion card is liquid cooled, only this liquid cooled expansion card may be retained using the lock down device 100 of FIGS. 1A-1E and other types of lock down devices may be used for securing other expansion cards, if any, installed in the system.

Figure 1F:
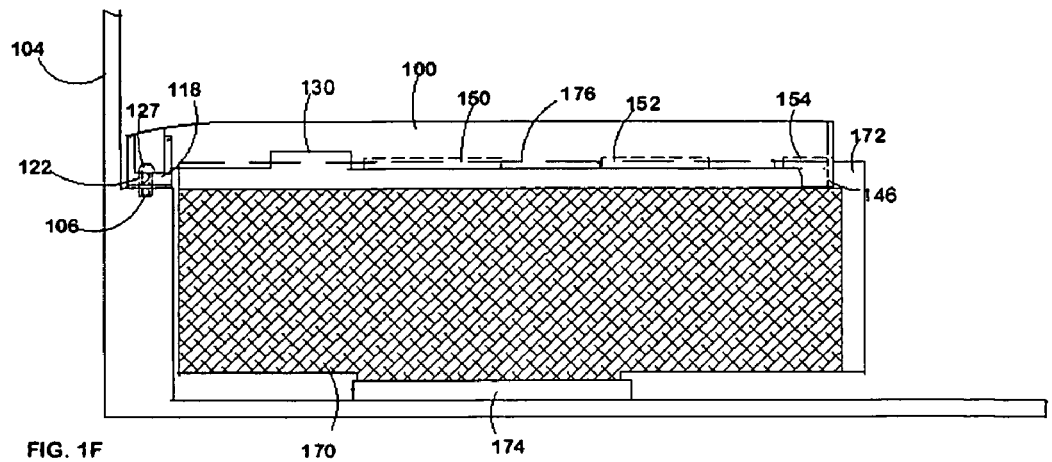
FIG. 1F illustrates the lock down device in accordance with the embodiment of FIG. 1 secured to a computer case, in accordance with an aspect of the invention.

FIG. 1F illustrates a lock down device 100 secured to a computer case 104, in accordance with an aspect of the invention. In this exemplary lock down device 100, screws 127 are fitted through receiving holes 122 and 124 of securing mechanism 125 and used to secure lock down device 100 to a computer case 104. The screws 127, which are placed through receiving hole 122 in lock down tab 118 and receiving hole 124 in lock down tab 120 are secured to the computer case 104 at threaded holes 106 of computer case 104. Threading holes 106 may be provided in computer case 104, for example, by the manufacturer of computer case 104. The top edge 176 and a portion of the keep out area 172 of expansion card 170 may be placed in seating slots 150, 152 and 154 and the bottom of the expansion card 170 placed in expansion slot 174. In the illustrated embodiment, a bridge is not used to connect the expansion card 170 with another card, however as noted above a bridge may be inserted at notch 130 for such implementations.

Figure 1G:
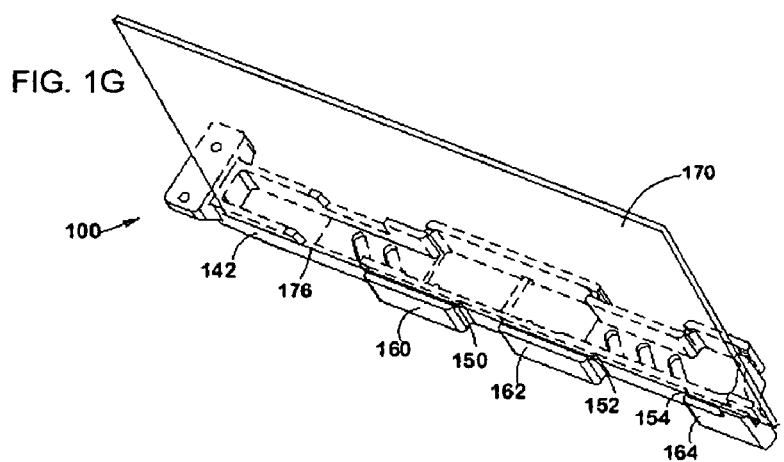
FIG. 1G is a perspective view of the lock down device in accordance with the embodiment of FIG. 1 secured to a computer case, in accordance with an aspect of the invention.

FIG. 1G illustrates another angle showing the relationship between the expansion card 170 and the seating slots 150, 152 and 154. As illustrated, expansion card top edge 176 rests in the seating slots 150, 152 and 154 in this example. Expansion card 170 may be supported on one side by side 142 and on the other by retaining walls 160, 162 and 164.

Figure 1H:
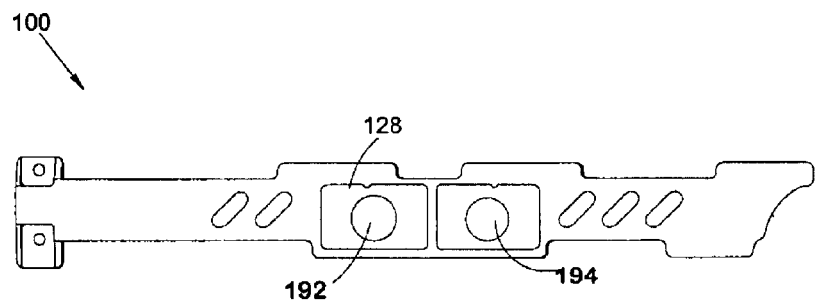
FIG. 1H illustrates a top down view of the lock down device in accordance with the embodiment of FIG. 1 receiving a liquid cooled expansion card with circulation tubes.
Figure 1I:
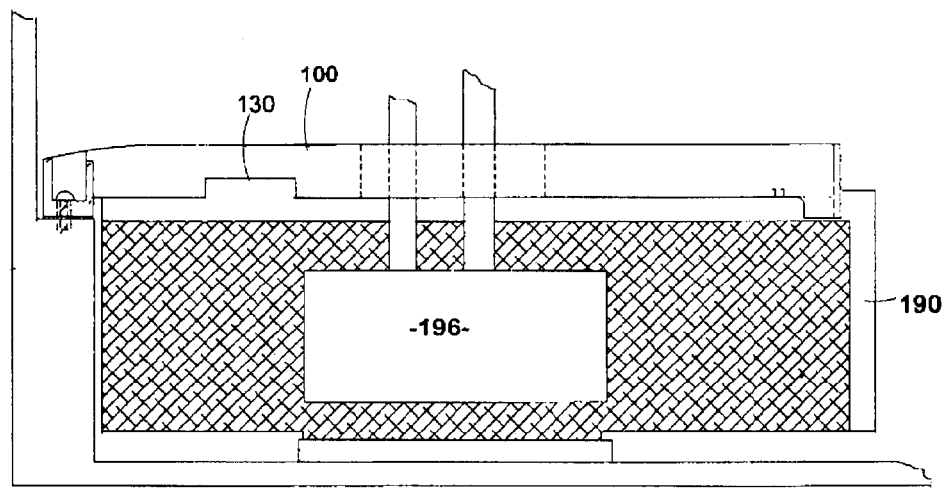
FIG. 1I illustrates a side view of the lock down device in accordance with the embodiment of FIG. 1 receiving a liquid cooled expansion card with circulation tubes.

FIGS. 1H and 1I illustrate a lock down device 100 receiving a liquid cooled expansion card 190 with circulation tubes 192 and 194 that cycle liquid to cool a heat sink 196. As illustrated, the circulation tubes 192 and 194 extend from the heat sink 196 through the tube receiving port 128 to the cooling area (not shown) of the liquid cooling system. As is known to those of skill in the art, this cooling area may be included elsewhere in computer case 104. As the placement of heat sink 196 and tubes 192 and 194 on expansion board 190 may vary, such as for example, depending upon the exact size of the expansion card 190 or the size of the heat sink 196, tube receiving port 128 may be larger than would be necessary to simply receive circulation tubes 192 and 194 to permit for variations in dimensioning and placement. Exemplary embodiments of the present invention may further comprise lock down devices 100 manufactured for expansion cards comprising specific cooling systems. For example, an embodiment may comprise a receiving port 128 dimensioned to only accept a specialized size and placement of the circulation tubes 192 and 194. Additionally, in an embodiment, rather than being used to receive circulation tubes 192 and 194, receiving port(s) 128 may be used for housing fans that may be, for example, mounted on the receiving port(s) 128 to provide increased circulation to the expansion card 190.

Figure 2:
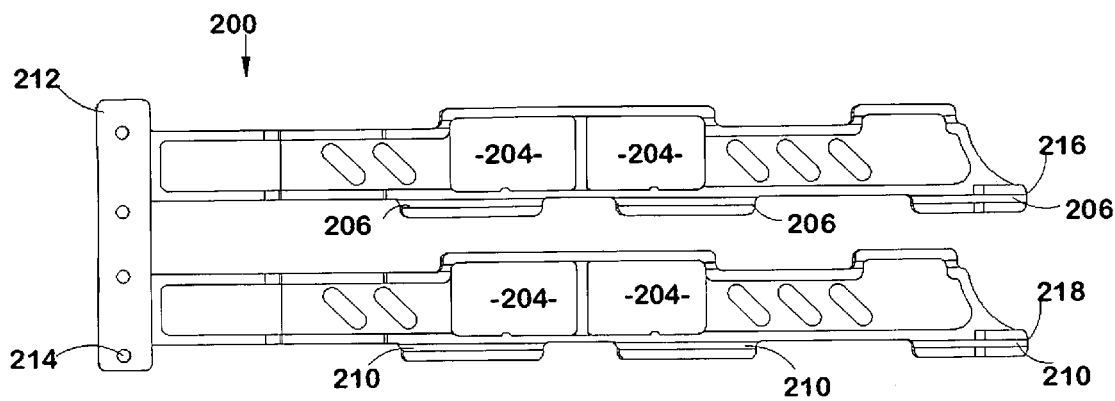
FIG. 2 is a view of the underside of an alternate embodiment of the lock down device that may accommodate two liquid cooled cards, in accordance with an embodiment of the present invention.

FIG. 2 illustrates an alternative embodiment of a lock down device, in accordance with an aspect of the invention. Lock down device 200 in this example is designed to simultaneously secure two items (e.g., two graphics cards) to a structure, such as, for example, a computer case. As illustrated, lock down device 200 comprises four (4) tube receiving ports 204. In examples in which lock down device 200 secures two graphics cards, these ports 204 may receive liquid cooling systems (e.g., circulation tubes) from the dual graphics cards. Further, lock down device may also comprise upper seating slots 206 and lower seating slots 210. The distance between upper seating slots 206 and lower seating slots 210 preferably is such that expansion cards may be simultaneously inserted into seating slots 206 and 210, the edge connectors of the two expansion cards inserted into adjacent expansion slots of the computer's motherboard, and lock down device secured to the computer's case using the case's standard securing system for securing expansion cards.

As with the single item lock down device 100 of FIGS. 1A-1I, lock down device 200 preferably comprises a lock down tab 212 that comprises receiving holes 214. Lock down tab 212 may be used to secure lock down device 200 to a structure, such as a computer case. In an embodiment in which lock down device 200 is to be used to secure expansion cards to a standardized computer case, lock down tab 212 is dimensioned such that it may be secured to a standardized securing mechanism of the computer case using receiving holes 214. In computer applications, lock down tab 212 may be expanded to span the standardized distance that may be typically provided for two expansion cards in order to accommodate the normal spacing between the expansion cards.

For example, in an embodiment in which lock down device is to secure graphics cards to a computer case, lock down tab 212 may be about three (3) inches long with receiving holes 214 positioned such that they will fit over pre-drilled screw holes in the computer case. Further, in this embodiment, lock down device may also include notches (not shown) for accepting a bridge between the two cards, such as, for example, notch 130 of the above-discussed lock down device 100. Although this description discusses exemplary dimensions for lock down tab 212 and holes 214, other dimensions may be used depending on, for example, the specifics of the particular use to which lock down device 200 is to be placed. For example, in instances where the items to be secured are particularly heavy or long, a rigid connector or bar (not shown) may be secured to distal end 216 and distal end 218 of lock down device 200 to prevent separation of the two distal ends 216 and 218 from one another. As with the lock down device 100 of FIGS. 1A-1I, the expansion card may be placed in receiving slots 206 and 210 to prevent lateral movement. The receiving port 204 can be divided as illustrated herein or modified as described in conjunction with the above-discussed figures.

Figure 3:
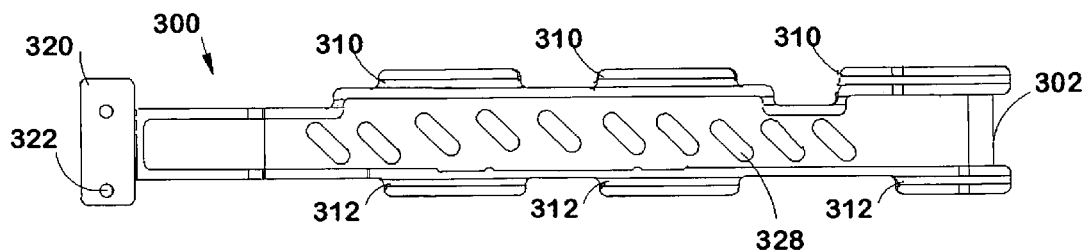
FIG. 3 is a view of the underside of an alternate embodiment of the lock down device that may accommodate two standard cards, in accordance with an embodiment of the present invention.

FIG. 3 illustrates yet another exemplary lock down device, in accordance with an aspect of the invention. Lock down device 300 comprises upper seating slots 310 and lower seating slots 312 on either side of body 302. This enables lock down device 300 to simultaneously secure two items, such as, for example two non-water cooled, expansion cards. In one such embodiment, the body 302 of lock down device 300 is dimensioned such that when expansion cards are seated into seating slots 310 and 312, the expansion slots of the two expansion cards may be inserted into adjacent expansion slots of the motherboard. Although, the embodiment of FIG. 3 does not include receiving ports such as those discussed above with reference to FIGS. 1A-1I and FIG. 2, it should be noted that the design of FIG. 3 may be modified accordingly to include such receiving ports. Lock down device 300 may be secured to a computer case, or other structure, through the use of lock down tab 320 and receiving holes 322. Further, vent holes 328 may extend across a substantial portion of the body 302 to permit air flow and to decrease the amount of materials used.

Figure 4:
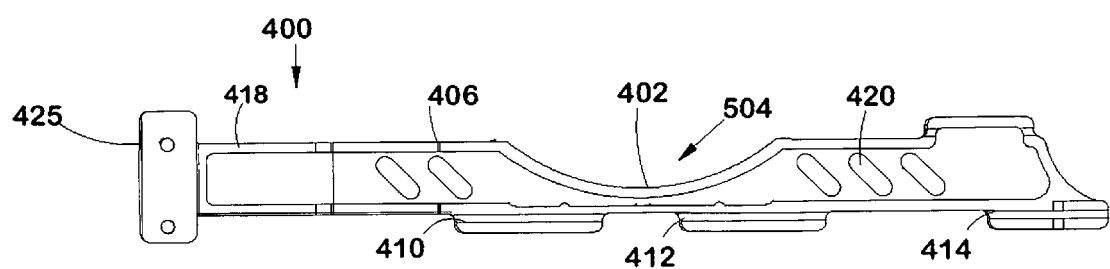
FIG. 4 is a underside view of an alternate embodiment of the lock down device having a curved receiving area for liquid cooled cards, in accordance with an embodiment of the present invention.

FIG. 4 illustrates a lock down device, in accordance with an aspect of the invention. Receiving port 404 of lock down device 400 is formed by a portion of side 418 arcing at curved coolant receiving wall 402. Side 418, containing receiving wall 402 opposes the seating slots 410, 412, 414 may have an arc that provides sufficient clearance for a coolant system of an expansion card (e.g., a liquid cooled graphics card). In this embodiment, additional strengthening may be added to lock down device 400 using, for example, one or more of the above discussed strengthening mechanisms, such as the above-discussed ribs 406. The dimensioning between the seating slots 410, 412 and 414 may be such to prevent circulation tubes (not shown) to be positioned within the receiving area 404. Although vent holes 420 are illustrated in this example, they may be optional for cooling purposes as the receiving area 404 permits increased circulation. The securing mechanism 425 in this example may be identical to the securing mechanism in FIGS. 1A-1I, however as with the other embodiments other securing mechanism may also be used.

Figure 5:
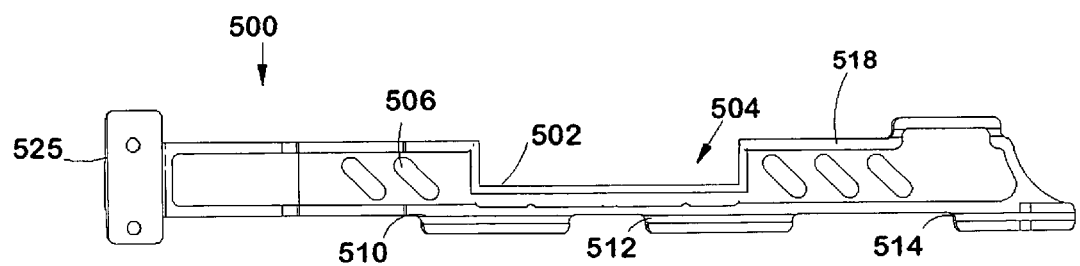
FIG. 5 is an underside view of an another embodiment of the lock down device having a squared receiving area for liquid cooled cards, in accordance with an embodiment of the present invention.

FIG. 5 illustrates a lock down device comprising an alternate method for providing clearance for a coolant system of a liquid cooled expansion card, in accordance with an aspect of the invention. As illustrated, lock down device 500 includes a receiving port 504, which, as illustrated, is formed by a rectangular notched wall 502 formed in side 518 opposite seating slots 510, 512 and 514. As with the embodiment of FIG. 4, although not illustrated, lock down device 500 may also comprise one or more additional strengthening mechanisms, such as, for example, ribs 506. The dimensioning between the seating slots 510, 512 and 514, as stated with respect to FIG. 4, may be such to prevent circulation tubes (not shown) to be positioned within the receiving area 504. Although vent holes 520 are also illustrated in this example, they may be optional for cooling purposes. The securing mechanism 525 in this illustration is identical to the securing mechanism in FIGS. 1A-1H, however other securing mechanism may also be used.

Figure 6:
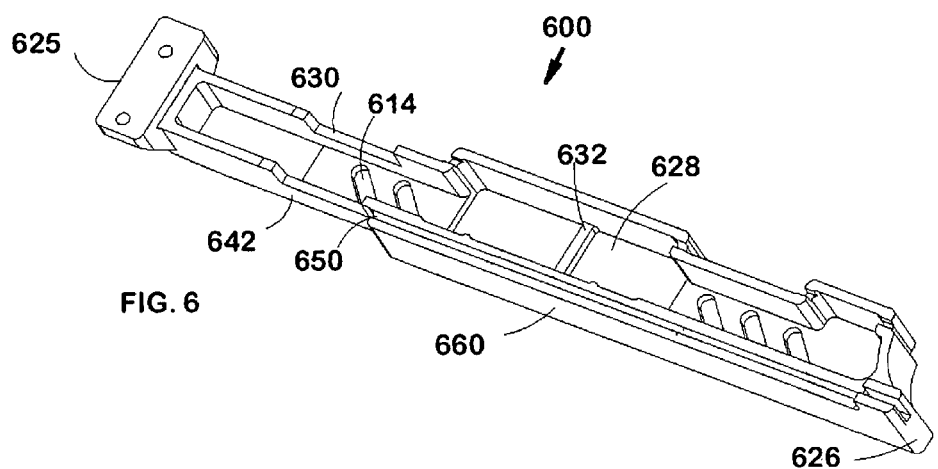
FIG. 6 illustrates a lock down device comprising a single seating slot, in accordance with an aspect of the invention.

The heretofore embodiments have had multiple seating slots. FIG. 6 illustrates a lock down device 600 having a single seating slot 650. Seating slot 650 may be formed by side 642 and retaining wall 660 and extend from the distal end 626 to the notch 630. The securing mechanism 625 may be any type of securing mechanism, such as those described herein. The lock down device 600 may further comprise vent holes 614 and a receiving port 628 divided by brace 632. The seating slot 650 may extend the length of the side 642. Or, for example, in embodiments, comprising a notch 630, such as illustrates in FIG. 6, seating slot 650 may extend from distal end 626 to notch 630, such as illustrated.

Figure 7:
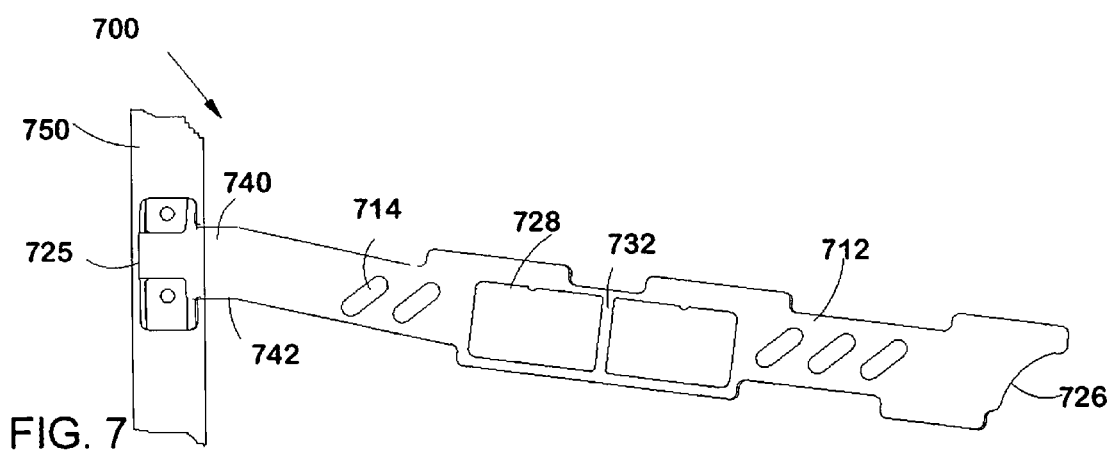
FIG. 7 illustrates a lock down device comprising an angled body, in accordance with an aspect of the invention.

Although the below described embodiments illustrate a lock down device extending from a structure at a 90 degree angle, this is not intended in any way to restrict coverage and other angles, as may be required in the application, may be used without departing from the scope of the invention. An example of an angled mount is illustrated in FIG. 7 wherein securing mechanism 725 is secured in a parallel manner with structure 750. Securing mechanism 725 and structure 750 may be, for example, any of the mechanisms or structures described herein. From the securing mechanism 725 the lead 740 is at a right angle to the structure 750. At a predetermine point 742, which may be based on materials used and/or end use, the body 712 angles, continuing straight to distal end 726. The lock down device 700 is illustrated with vent holes 714, receiving port 728 and brace 732.

Figure 8A:
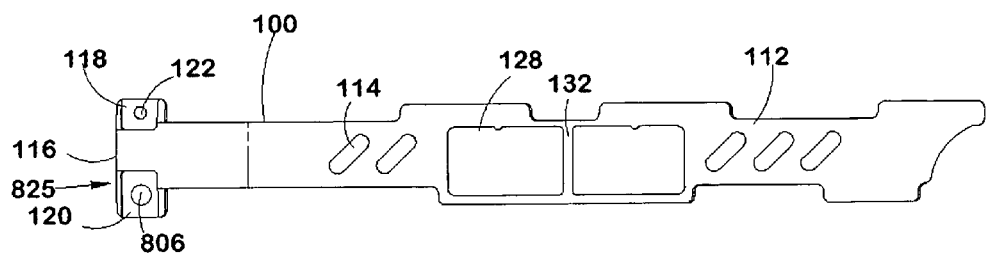
FIG. 8A is a top down view of an alternate method of securing the lock down device to the support structure, in accordance with an embodiment of the present invention.
Figure 8B:
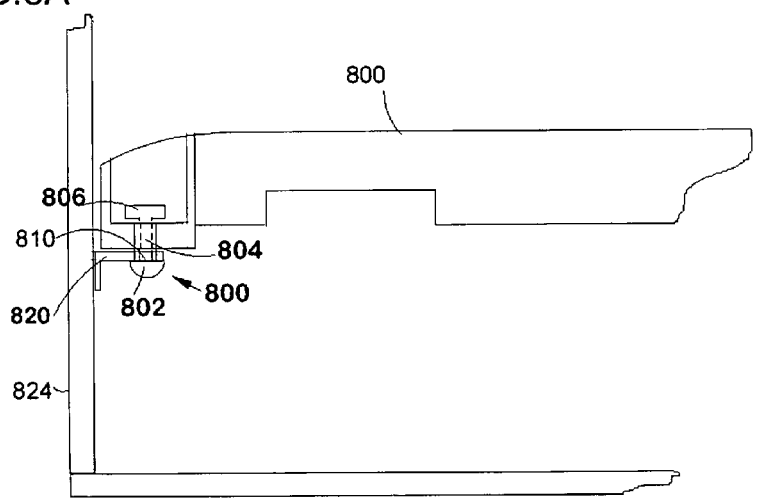
FIG. 8B is a partial side view of the alternate method of securing the lock down device to the support structure, in accordance with an embodiment of FIG. 8.

FIGS. 8A and 8B illustrate another securing mechanism 825 which may be used with a lock down device 801 (expansion card not shown). Other than the securing mechanism 825, lock down device 801 may, for example, be identical to lock down device 100. As illustrated, lock down device 801 includes air vents 114, receiving ports 128 and brace 132 placed as described heretofore in elongated body 112. In this example, securing mechanism 825 comprises a button lock 800 that may be used in place of screws as were used in the embodiment of FIG. 1. Button lock 800 may be inserted into receiving holes 120 (not shown) and 122 in lock down tabs 118 and 120 respectively at proximal end 116. Button lock 800 may have a button shaped locking tab 802 attached, at flat side 810, to neck 804 that is dimensioned to be received within receiving holes 122 and 124 (not shown) of lock down tabs 118 and 120 (not shown) of lock down device 100. The uncompressed diameter of the flat side 810 of locking tab 802 may be greater than the diameter of the receiving hole 122 and receiving hole 828 of retaining area 820. Restraining tab 806 is dimensioned to prevent button lock 800 from passing through receiving holes 122 and 124. The neck 804 has a length sufficient to pass through lock down tab 120 as well as the retaining area 820 of structure 824. The button lock 800 may be manufactured from a semi-rigid material that permits locking tab 802 to compress a sufficient amount to enable it to pass through receiving hole 122 and receiving hole 828 of retaining area 820. Once the locking tab 802 has passed through receiving hole 122 and receiving hole 828 of retaining area 820, it expands back to its original dimensions, thereby preventing the button lock 800 from being removed. Once inserted, button lock 800 may be cut to be removed.

Figure 9A:
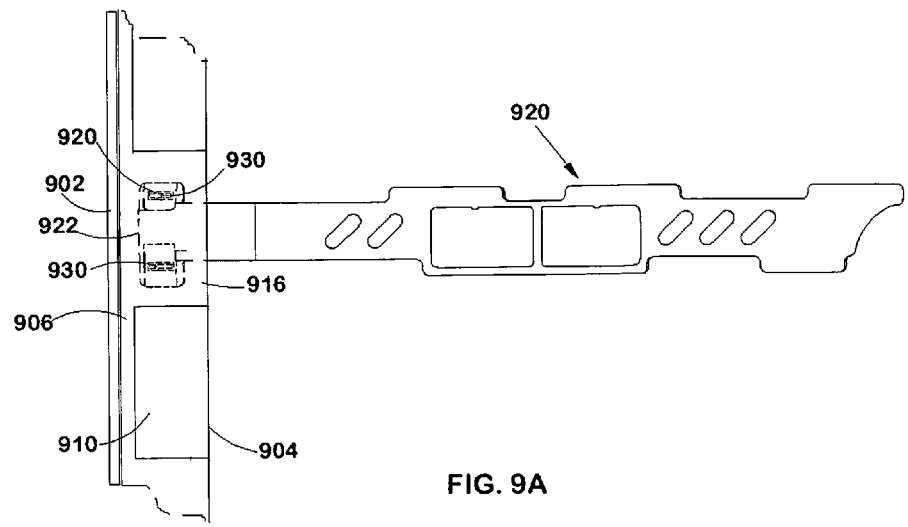
FIG. 9A is a top down view of an alternate method of securing the lock down device to the support structure, in accordance with an embodiment of the present invention.
Figure 9B:
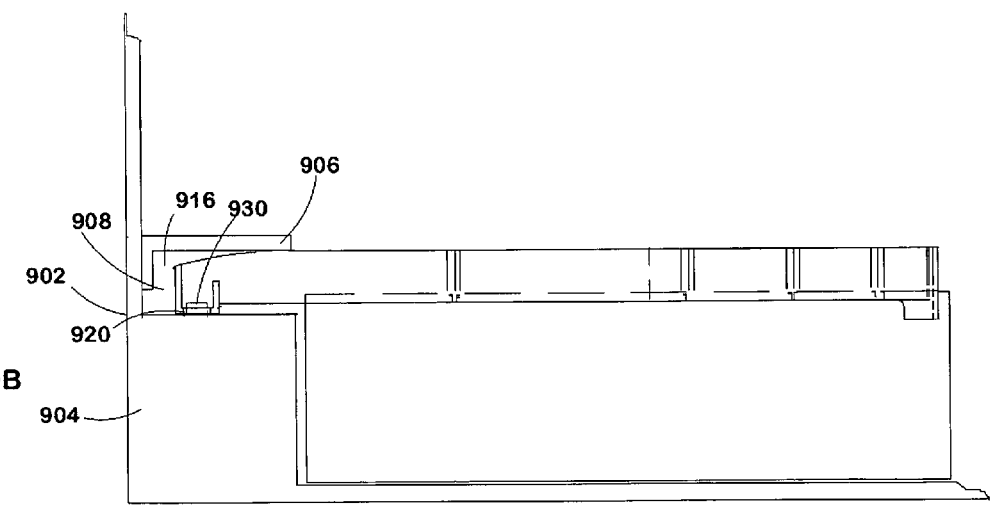
FIG. 9B is a partial side view of the alternate method of securing the lock down device to the support structure, in accordance with an embodiment of FIG. 9.
Figure 9C:
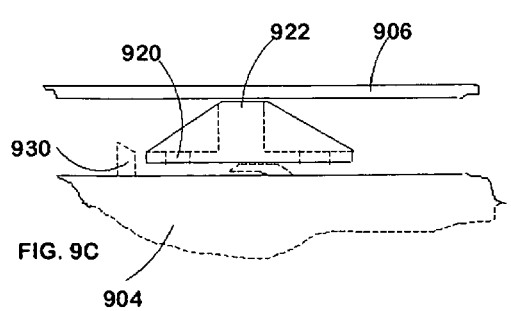
FIG. 9C is a partial close-up side view of the alternate method of securing the lock down device to the support structure during securing, in accordance with an embodiment of FIG. 9.
Figure 9D:
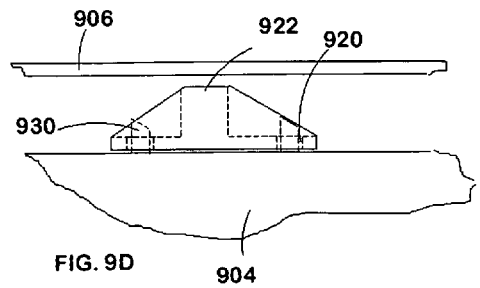
FIG. 9D is a partial close-up side view of the alternate method of securing the lock down device to the support structure after securing, in accordance with an embodiment of FIG. 9.
Figure 10A:
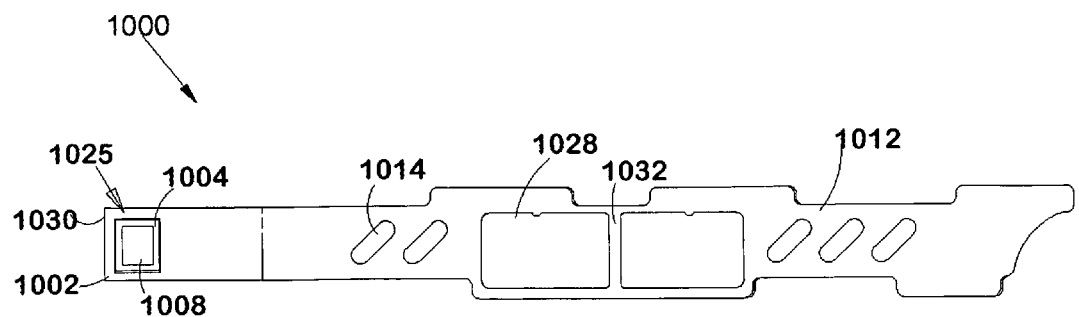
FIG. 10A is a top down view of an alternate method of securing the lock down device to the support structure, in accordance with an embodiment of the present invention.
Figure 10B:
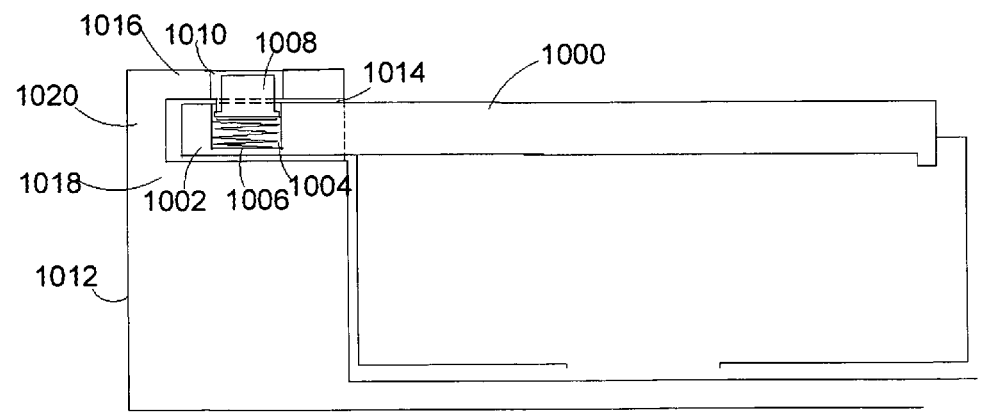
FIG. 10B is a partial side view of the alternate method of securing the lock down device to the support structure, in accordance with an embodiment of FIG. 10.

FIGS. 9A, 9B, 9C and 9D illustrate and alternate embodiment of a lock down device 900. As illustrated lock down device 900 may be secured to a support structure 902 having a base 904 and top plate 906, secured parallel to and spaced from the base 904 to form a channel 908. The top plate 906 has cut away sections 910, dimensioned to receive the proximal end 922 of lock down device 900. A portion of base 904 may be directly accessible at the cut away sections 910 to enable the proximal end 922 of the lock down device 900 to be placed onto the base 904. In this embodiment, proximal end 922 of lock down device 920 contains receiving slots 920 which are dimensioned to receive flanges 930 within base 904. The flanges 930 may be a flexible material that will bend, as illustrated in FIG. 9C as the lock down device 920 is slid across the base 904. The proximal end 922 is inserted into cut away section 910 and then slid into enclosed area 906 where it is secured as the flanges 930 interact with the receiving slots 920 as seen from an end view in FIG. 9D. The manner of securing proximal end 922 within enclosed area 906 may be any method applicable to the materials of manufacture and end use and the illustrated example is not all inclusive and should be in no way considered limiting to the methods of attachment FIGS. 10A and 10B illustrate a lock down device 1000 comprising an alternative securing mechanism 1025 for securing expansion card 1000 to structure 1012, such as a computer case, in accordance with an aspect of the invention. Lock down device 1000 may be identical to the above-discussed lock down device 100 of FIGS. 1A-1E with the exception that securing mechanism 125 is replaced with securing mechanism 1025. Although, this securing mechanism 1025 will be discussed with reference to lock down device 1000, it may also be used in other types of lock down devices, such as, for example, lock down devices 200, and 300.

As shown, securing mechanism 1025 comprises a snap lock system comprising a lock down device tongue 1002 at the distal end 1030 of the lock down device 1000. The locking mechanism 1025 includes a chamber 1004 in which there is a spring 1006 and a button 1008. Further, in this example, structure 1012 comprises receiving inlet 1014, dimensioned to receive the lock down device tongue 1002, and a receiving chamber 1010, dimensioned to receive the button 1008.

When lock down device 1000 is secured to structure 1012, spring 1006 pushes button 1008 upward so that a substantial portion of button 1008 extends out of chamber 1004 above the top surface of tongue 1002 and into button receiving chamber 1010 of support structure 1012. When spring 1006 is uncompressed, the portion of button 1008 extending into receiving chamber 1010 prevents lock down device 1000 from being removed from its position in structure inlet 1014. To remove lock down device 1000, a person may depress button 1008 into chamber 604 until it is recessed sufficiently to permit tongue 1002 to be slid out of inlet 1014. In the embodiment of FIG. 10B, when spring 1006 is uncompressed, button 1008 only extends part way up receiving chamber 1010 to avoid inadvertent depression of button 1008 that may result in unintentional dislodgement of lock down device 1000. However, in other embodiments other dimensioning may be used without departing from the scope of the invention. In the illustrated embodiment, the lock down device 1000 has vent holes 1014 with circulation tubes 1072 and 1074 extending through receiving port 1028, which has been divided by brace 1032. However, the securing mechanism 1025 can be incorporated into other illustrated embodiments as disclosed herein.

FIG. 11 illustrates an alternate mechanism for securing a lock down device to a structure, in accordance with an aspect of the invention. For ease in explanation the securing mechanism of FIG. 11 will be described with reference to lock down device 100 of FIG. 1, however, the presently described securing mechanism is also applicable for securing other lock down devices, such as those described above with reference to FIGS. 2-3 and 5-6.

Figure 11A:
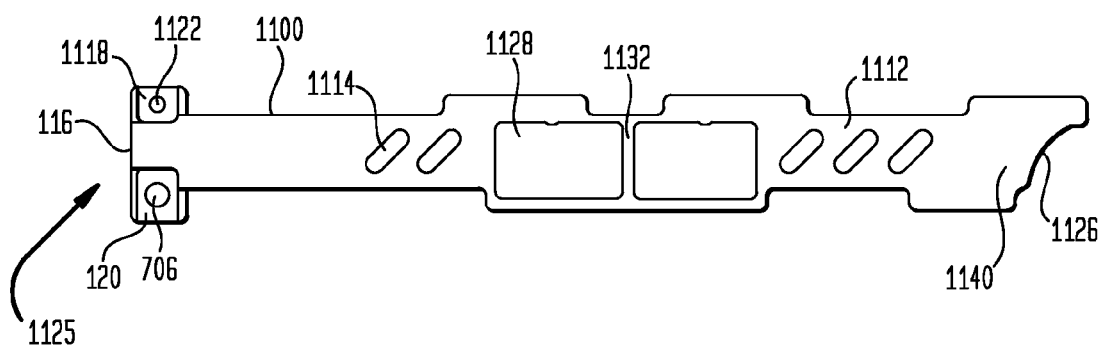
FIG. 11A is a top down view of an alternate method of securing the lock down device to the support structure, in accordance with an embodiment of the present invention.
Figure 11B:
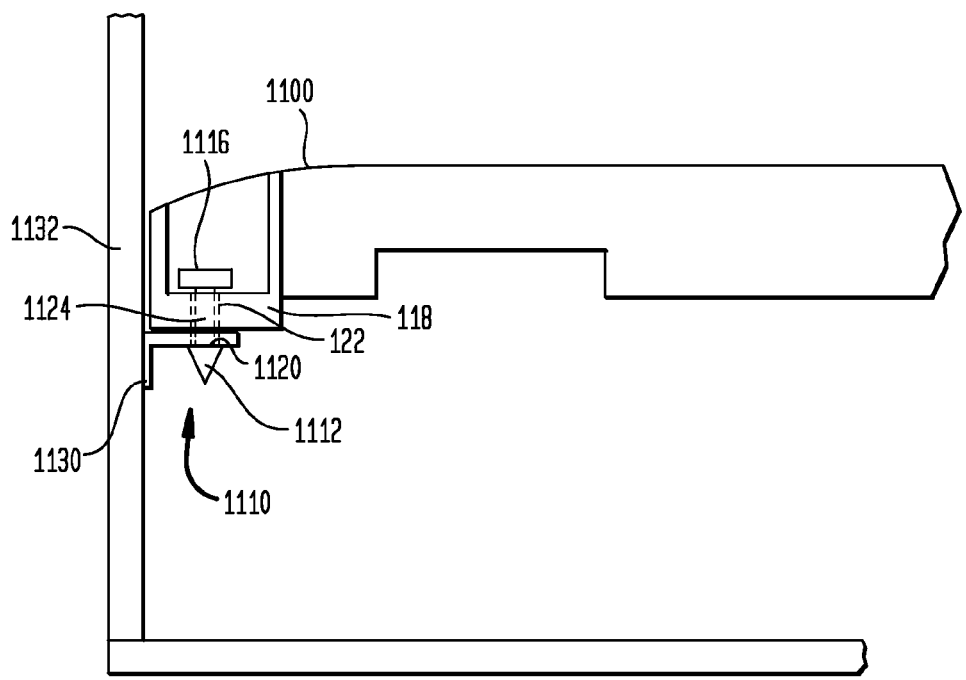
FIG. 11B is a partial side view of the alternate method of securing the lock down device to the support structure, in accordance with an embodiment of FIG. 11.

FIGS. 11A and 11B illustrate a lock down device 1100 comprising another securing mechanism 1125. Lock down device 1100 may be identical to lock down device 100 with the exception of securing mechanism 1125. Lock down device 1100 is illustrated with air vents 1114, receiving ports 128 and brace 132 placed as described heretofore in elongated body 112. The V-lock 1110 illustrated herein is used in place of screws, which may be used, as discussed above, in securing lock down device 100 to a structure. V-lock 1110 may be inserted into receiving holes 120 (not shown) and 122 in the lock down tabs 118 and 120 respectively at proximal end 116. V-lock 1110 comprises a V-shaped locking tab 1172 attached, at flat side 1120, to neck 1124 that is dimensioned to be received within receiving holes 122 and 124 (not shown) of lock down tabs 118 and 120 (not shown) of lock down device 100. The uncompressed diameter of the flat side 1120 of locking tab 1110 is greater than the diameter of the receiving hole 122 and receiving hole 1128 of retaining area 1130. Restraining tab 1116 is dimensioned to prevent V-lock 1110 from passing through receiving holes 122 and 124. The neck 1114 has a length sufficient to pass through lock down tab 120 as well as the retaining area 1130 of structure 1132. The V-lock 1110 may be manufactured from a semi-rigid material that permits locking tab 1130 to compress a sufficient amount to enable it to pass through receiving hole 122 and receiving hole 1128 of retaining area 1130. Once the locking tab 1112 has passed through receiving hole 122 and receiving hole 1128 of retaining area 1130, it expands back to its original dimensions, thereby preventing the V-lock 1110 from being removed. Once inserted, the V-lock 1110 may be cut to be removed.

It should be noted that the foregoing are examples of alternate securing mechanisms and other methods and designs will become apparent to those skilled in the arts.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A lock down device for securing one or more items to a support structure, the lock down device comprising:
    a securing mechanism configured to receive a locking mechanism for use in securing the lock down device to the support structure,
    at least one receiving port extending through the lock down device and receiving one or more circulation tubes; and
    at least one set of one or more seating slots, wherein at least one set of seating slots is along a side of the lock down device and dimensioned for holding at least a portion of the one or more items.

2. The device of claim 1 wherein the one or more items is a circuit board.

3. The device of claim 2 wherein the circuit board is liquid cooled.

4. The device of claim 1 further comprising at least one bridge notch configured for securing a bridge useable in interconnecting at least two of the one or more items.

5. The device of claim 4 wherein the at least one bridge notch comprises a pair of bridge notches opposing one another in a first side and a second side of the lock down device.

6. The device of claim 1 further comprising a brace, the brace spanning the receiving port to provide structural rigidity.

7. The device of claim 1 wherein the securing mechanism comprises at least one locking tab comprising at least one screw receiving hole.

8. The device of claim 1 wherein one of the at least one set of seating slots is L-shaped to provide additional rigidity to the lock down device.

9. The device of claim 1 further comprising one or more ribs, wherein at least one rib extends along at least one side of the lock down device.

10. The device of claim 9 wherein the ribs are located proximate at least one of the at least one receiving port.

11. The device of claim 1 wherein at least one of the receiving ports is an arched portion of a side opposing the seating slots.

12. The device of claim 1 wherein at least one of the receiving ports is a rectangular portion of a side opposing the seating slots.

13. The device of claim 1 wherein the locking mechanism comprises at least one V-shaped lock comprising a V-shaped locking tab, a neck and a restraining tab.

14. The device of claim 1 wherein the locking mechanism comprises a button lock comprising a button-shaped locking tab, a neck and a restraining tab.

15. A lock down device for securing one or more items to a support structure, the lock down device comprising:
    a securing mechanism configured to receive a locking mechanism for use in securing the lock down device to the support structure,
    at least one receiving port extending through the lock down device; and
    at least one set of one or more seating slots, wherein at least one set of seating slots is along a side of the lock down device and dimensioned for holding at least a portion of the one or more items,
    wherein the support structure further comprises a top plate and a base forming a channel, and the securing mechanism comprises a receiving mechanism to secure the locking mechanism to the support structure,
    wherein the receiving mechanism is a hole within the top plate to receive an uncompressed button,
    wherein the locking mechanism comprises a chamber having a spring and a button, the button resting on the spring and extending above the chamber of the locking mechanism when uncompressed and being recessed into the chamber when compressed, the locking mechanism interacting with the securing mechanism of the support structure.

16. A lock down device for securing one or more items to a support structure, the lock down device comprising:
    a securing mechanism configured to receive a locking mechanism for use in securing the lock down device to the support structure,
    at least one receiving port extending through the lock down device; and at least one set of one or more seating slots, wherein at least one set of seating slots is along a side of the lock down device and dimensioned for holding at least a portion of the one or more items, wherein the support structure further comprises a top plate and a base forming a channel, and the securing mechanism comprises a receiving mechanism to secure the locking mechanism to the support structure, and wherein the channel is dimensioned to receive the locking mechanism, and wherein the locking mechanism comprises one or more flanges positioned on the base of the support structure to interact with the receiving mechanism upon contact with the receiving mechanism to retain the lock down device.

17. The device of claim 1 wherein the at least one set of one or more seating slots, comprises:
an upper set of one or more seating slots along a first side of the device and dimensioned for holding at least a portion of a first item; and
a lower set of one or more seating slots along a second side of the device and dimensioned for holding at least a portion of a second item.

18. A lock down device comprising:
a securing mechanism comprising one or more locking tabs each comprising one or more screw receiving holes for securing the lock down device to a computer case,
a first set of one or more seating slots along a first side of the lock down device dimensioned for holding at least a portion of a first circuit board; and
a second set of one or more seating slots along a second side of the lock down device dimensioned for holding at least a portion of a second circuit board,
a first bridge notch in the first side, the first bridge notch configured to secure a bridge useable in interconnecting the first circuit board with at least the second circuit board; and
a second bridge notch in the second side, the second bridge notch configured to secure the bridge useable in interconnecting the first circuit board with at least the second circuit board.

19. The device of claim 18 further comprising at least one receiving port extending through the lock down device.

20. The device of claim 18 further comprising a brace spanning the receiving port to provide structural rigidity.

21. The device of claim 18 wherein at least one of the seating slots is L-shaped to provide additional rigidity.

22. The device of claim 18 further comprising one or more ribs, wherein at least one rib extends along at least one side of the lock down device.

23. The device of claim 22 wherein the one or more ribs include interior ribs located proximate the receiving port.

24. The device of claim 18, wherein the first and second circuit boards are expansion cards.

25. The device of claim 24, wherein the expansion cards are graphics cards.

26. The device of claim 25, wherein the graphics cards are capable of being interconnected by a bridge.

27. A method of retaining a circuit board within a computer case, the method comprising:
placing an edge connector of the circuit board into a slot in the computer case;
placing circulating tubes for a liquid cooling system through a receiving port;
placing each of a set of one or more seating slots of a lock down device on a keep out area of the circuit board; and
attaching the lock down device to a computer case using a securing mechanism of the lock down device.

28. The method of claim 27 further comprising:
placing an edge connector of a second circuit board into a second slot in the computer case;
placing circulating tubes for a liquid cooling system through a receiving port;
placing each of a second set of one or more seating slots of a second lock down device on a keep out area of the second circuit board; and
attaching the lock down device to a computer case using a securing mechanism of the lock down device.

29. The method of claim 27 further comprising:
connecting the first and second circuit boards using a bridge; and
positioning the bridge within a notch of the lock down device.

30. A method of retaining multiple circuit boards within a computer case, the method comprising:
placing an edge connector of a first circuit board into a first slot in the computer case;
placing an edge connector of a second circuit board into a second slot in the computer case;
placing circulating tubes for a liquid cooling system of one circuit board through a receiving port;
placing circulating tubes for a liquid cooling system of another circuit board through a receiving port;
placing each of a first set of one or more seating slots of a lock down device on a keep out area of the first circuit board;
placing each of a second set of one or more seating slots of the lock down device on a second circuit board; and
attaching the lock down device to a computer case using a securing mechanism of the lock down device.

31. The method of claim 30 further comprising:
connecting the first and second circuit boards by connecting a bridge between the first and second circuit boards, the bridge being positioned within a notch in the lock down device.

32. A lock down device for securing one or more items to a support structure, the lock down device comprising:
a first body comprising at least one receiving port extending through the first body configured to receive one or more circulation tubes and at least one set of one or more seating slots, wherein at least one set of seating slots is along a side of the lock down device and dimensioned for holding at least a portion of a first item;
a second body comprising at least one receiving port extending through the second body configured to receive one or more circulation tubes and at least one set of one or more seating slots, wherein at least one set of seating slots is along a side of the lock down device and dimensioned for holding at least a portion of a second item; and
a securing mechanism extending between the first body and the second body and configured to receive a locking mechanism for use in securing the lock down device to the support structure.

33. The device of claim 1, wherein the lock down device is secured to the support structure at the proximal end of the lock down device.

34. The device of claim 15, wherein the at least one receiving port is configured to receive one or more circulation tubes.

35. An apparatus comprising the device of claim 15 and a circuit board.

36. The apparatus of claim 35, wherein the circuit board comprises an expansion card.

37. The apparatus of claim 36, wherein the expansion card comprises a video card.

38. The apparatus of claim 35, wherein the circuit board is liquid cooled.

39. A computer comprising the device of claim 15.

40. The device of claim 16, wherein the at least one receiving port is configured to receive one or more circulation tubes.

41. The device of claim 16, wherein the one or more flanges become inserted into the receiving mechanism when received by the securing mechanism to retain the lock down device.

42. The device of claim 16, wherein the receiving mechanism comprises one or more receiving slots.

43. An apparatus comprising the device of claim 16 and a circuit board.

44. The apparatus of claim 43, wherein the circuit board comprises an expansion card.

45. The apparatus of claim 44, wherein the expansion card comprises a video card.

46. The apparatus of claim 43, wherein the circuit board is liquid cooled.

47. A computer comprising the device of claim 16.

48. An apparatus comprising the device of claim 18 and a circuit board.

49. The apparatus of claim 48, wherein the circuit board comprises an expansion card.

50. The apparatus of claim 49, wherein the expansion card comprises a video card.

51. The apparatus of claim 48, wherein the circuit board is liquid cooled.

52. A computer comprising the device of claim 18.

53. A lock down device comprising:
a securing mechanism comprising one or more locking tabs for securing the lock down device to a computer case,
a first set of one or more seating slots along a first side of the lock down device dimensioned for holding at least a portion of a first circuit board; and
a second set of one or more seating slots along a second side of the lock down device dimensioned for holding at least a portion of a second circuit board,
a first bridge notch in the first side, the first bridge notch configured to secure a bridge useable in interconnecting the first circuit board with at least the second circuit board; and
a second bridge notch in the second side, the second bridge notch configured to secure the bridge useable in interconnecting the first circuit board with at least the second circuit board.

54. The device of claim 53, wherein the one or more locking tabs of the lock down device are secured to the computer case by a locking mechanism.

55. The device of claim 54, wherein the locking mechanism comprises at least one V-shaped lock comprising a V-shaped locking tab, a neck and a restraining tab.

56. The device of claim 54, wherein the locking mechanism comprises a button lock comprising a button-shaped locking tab, a neck and a restraining tab.

\* \* \* \* \*